US012578619B2

(12) United States Patent
Aliane et al.

(10) Patent No.: US 12,578,619 B2
(45) Date of Patent: Mar. 17, 2026

(54) CURRENT-ASSISTED PHOTONIC DEMODULATOR WITH IMPROVED PERFORMANCES INCLUDING INTERMEDIATE ELECTRODES

(71) Applicant: COMMISSARIAT A L'ENERGIE ATOMIQUE ET AUX ENERGIES ALTERNATIVES, Paris (FR)

(72) Inventors: Abdelkader Aliane, Grenoble (FR); Hacile Kaya, Grenoble (FR); Quentin Durlin, Grenoble (FR); Jean-Michel Hartmann, Grenoble (FR); Luc Andre, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 263 days.

(21) Appl. No.: 18/519,849

(22) Filed: Nov. 27, 2023

(65) Prior Publication Data

US 2024/0176207 A1 May 30, 2024

(30) Foreign Application Priority Data

Nov. 29, 2022 (FR) ...................................... 2212468

(51) Int. Cl.
| | |
|---|---|
| *G02F 2/00* | (2006.01) |
| *H10F 30/221* | (2025.01) |
| *H10F 30/24* | (2025.01) |
| *H10F 77/30* | (2025.01) |

(52) U.S. Cl.
CPC ............. *G02F 2/00* (2013.01); *H10F 30/221* (2025.01); *H10F 30/24* (2025.01); *H10F 77/306* (2025.01)

(58) Field of Classification Search
CPC .......... G02F 2/00; H10F 30/24; H10F 77/306
See application file for complete search history.

(56) References Cited

U.S. PATENT DOCUMENTS

| | | | | |
|---|---|---|---|---|
| 9,343,607 | B2 * | 5/2016 | Buettgen ........... | H10F 39/80373 |
| 2015/0001664 | A1 * | 1/2015 | Van Der Tempel .. | G01S 17/894 |
| | | | | 257/432 |
| 2023/0155050 | A1 * | 5/2023 | Chowdhury .......... | H10F 77/147 |
| | | | | 257/186 |
| 2024/0192440 | A1 * | 6/2024 | Aliane ................... | G02B 6/134 |

OTHER PUBLICATIONS

Search Report for French Application No. 22 12468 dated Oct. 17, 2023.
Gian-Franco Dalla Betta et al: "Design and Characterization of Current-Assisted Photonic Demodulators in 0.18-μm CMOS Technology", IEEE Transactions on Electron Devices, IEEE, USA, vol. 58, No. 6, Jun. 1, 2011, pp. 1702-1709, XP011323216, ISSN: 0018-9383, DOI: 10.1109/TED.2011.2126578.

* cited by examiner

*Primary Examiner* — Daniel Petkovsek
(74) *Attorney, Agent, or Firm* — McDonald Hopkins LLC

(57) ABSTRACT

A current-assisted photonic demodulator includes a detection portion having two doped modulation regions and two doped collection regions, lying flush with a first face covered by a dielectric layer. Electrodes pass through the dielectric layer and come into contact with the doped regions. In addition, intermediate electrodes partly pass through the dielectric layer and are spaced apart from the first face by a non-zero distance, each being located, in projection in a main plane, between one of the doped modulation regions and the adjacent doped collection region.

14 Claims, 6 Drawing Sheets

Y
Z      X

1

Zc

24

12   I1   11          11   I2   12

1

11

Zc

24

12          I1          I2          12

1

11

Zc

24

12   I1          I2          12

CURRENT-ASSISTED PHOTONIC DEMODULATOR WITH IMPROVED PERFORMANCES INCLUDING INTERMEDIATE ELECTRODES

This application claims priority to French Patent Application 22 12468 filed Nov. 29, 2022, the entire disclosure of which is incorporated by reference herein.

TECHNICAL FIELD

The field of the invention is that of current-assisted photonic demodulators (CAPDs) adapted to detect light radiation in the near infrared. The invention finds an application in particular in telemetry, biological analysis and industrial inspection (contactless detection of surface defects).

PRIOR ART

Current-assisted photonic demodulators are photodetectors wherein the distribution of a drift electric field is modulated. They were initially described in particular in the scientific article by Van Nieuwenhove et al. entitled *Novel Standard CMOS Detector using Majority Current for guiding Photo-Generated Electrons towards Detecting Junctions*, Proc. Symp. IEEE/LEOS Benelux Chapter, pp. 229-232, 2005. This type of optoelectronic device is particularly used in telemetry for measuring time of flight (TOF).

Such a demodulator normally includes a detection portion made from a lightly p-doped semiconductor material that has, on one of its faces, two p+ doped regions for generating a drift current, and two n+ doped regions located in proximity to the p+ doped regions for collecting the photocurrent. An electrical potential difference is applied between the p+ regions, which generates a drift electric field in the detection portion. Thus, when light radiation is absorbed in the detection portion, an electron-hole pair is generated, then the photogenerated hole propagates under the effect of the drift field in the direction of the p+ doped region having the lowest electrical potential, whereas the photogenerated electron is directed in the direction of the opposite p+ doped region, and is then collected by the adjacent n+ doped region. Thus the photocurrent can be measured effectively by the demodulator.

Because of the separation between the current of the majority holes and the photocurrent (minority electrons), the contribution of the current of the majority holes to the shot noise and to the thermal noise is thus limited. However, there is a need to improve the performances of such a current-assisted photonic demodulator.

DESCRIPTION OF THE INVENTION

The objective of the invention is to propose a current-assisted photonic demodulator having improved performances, in particular in terms of AC demodulation contrast, parasitic light sensitivity, and bandwidth. A secondary objective is to propose a photonic demodulator adapted to detect light radiation in the near infrared. Another secondary objective is to propose a matrix of photon demodulators having a high fill factor.

For this purpose, the object of the invention is a current-assisted photonic demodulator adapted to detect light radiation of interest (i.e. a light radiation in a predefined spectral band). It comprises:

a detection portion, extending vertically between a first face and a second face both parallel to a main plane, and including: at least two p-doped regions, intended to generate and modulate a drift current in the detection portion, lying flush with the first face and located on either side of a central zone of the first face; and at least two n-doped region, adapted to collect the minority charge carriers photogenerated during the absorption of the light radiation of interest in the detection portion, lying flush with the first face and located adjacent to the p-doped regions;

a dielectric passivation layer, produced from an electrically insulating material, and covering the first face;

modulation electrodes, passing through the dielectric passivation layer and in contact with the p-doped regions; and collection electrodes, passing through the dielectric passivation layer and in contact with the n-doped regions.

According to the invention, the demodulator also includes intermediate electrodes, intended to be negatively biased, partly passing through the dielectric passivation layer and spaced apart from the first face by a non-zero distance, each being located, in projection in the main plane, between one of the p-doped regions and the adjacent n-doped region.

Some preferred yet non-limiting aspects of this photonic demodulator are as follows.

The intermediate electrodes can be spaced apart from the first face by a distance of between 5 nm and 50 nm.

The p-doped regions can have a depth from the first face greater than a depth of the n-doped regions.

The p-doped regions can be located, in projection in the main plane, in proximity to the central zone, and the n-doped regions are then distant therefrom.

The p-doped regions can be first semiconductor portions located in first indentations in the detection portion.

The n-doped regions can be first semiconductor portions located in second indentations in the detection portion.

The detection portion can be produced based on germanium.

The demodulator can include a peripheral lateral portion surrounding the detection portion in the main plane, produced from a semiconductor material based on silicon.

The detection portion can include a lateral zone produced based on SiGe, located at the interface with the peripheral lateral portion.

The invention also relates to a method for manufacturing a photonic demodulator according to any one of the preceding features, including the following steps:

producing the detection portion from a not intentionally doped material;

producing p-doped regions and n-doped regions in the detection portion;

depositing a dielectric passivation layer on the detection portion;

producing modulation electrodes, collection electrodes and intermediate electrodes.

The p-doped regions can have a depth from the first face greater than the depth of the n-doped regions.

Producing the p-doped regions can include the following steps:

producing first indentations in the detection portion as from the first face;

producing by epitaxy, in the first indentations, first semiconductor portions p-doped by growth.

Producing the n-doped regions can include the following steps:

producing second indentations in the detection portion as from the first face;

producing by epitaxy, in the second indentations, second semiconductor portions n-doped by growth.

The first indentations can have a depth greater than the depth of the second indentations.

BRIEF DESCRIPTION OF THE DRAWINGS

Other aspects, aims, advantages and features of the invention will appear better upon reading the following detailed description of preferred embodiments thereof, given as a non-limiting example, and made with reference to the appended drawings, wherein.

DETAILED DESCRIPTION OF PARTICULAR EMBODIMENTS

In the figures and in the remainder of the description, the same references represent identical or similar elements. In addition, the various elements are not represented to scale so as to promote clarity of the figures. Moreover, the different embodiments and variants are not mutually exclusive and can be combined together. Unless indicated otherwise, the terms "substantially", "approximately", "in the order of" mean within a 10% margin, and preferably within a 5% margin. Moreover, the terms "between . . . and . . . " and equivalents mean that the bounds are included, unless stated otherwise.

Figure 1A:
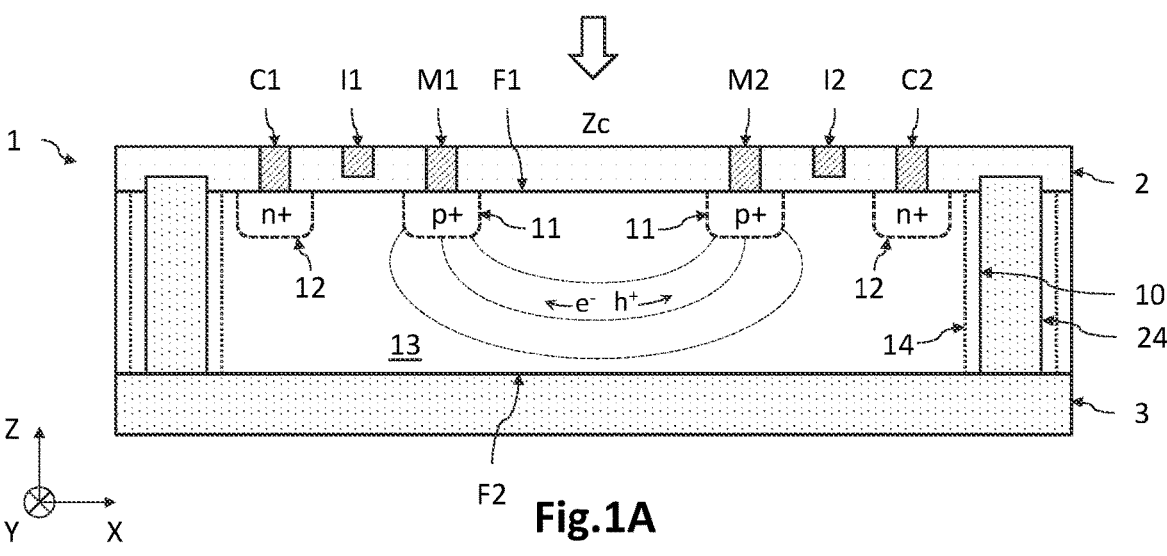
FIG. 1A, FIG. 1B and FIG. 1C are partial schematic views, in cross section, of current-assisted photonic demodulators according to various embodiments.

FIG. 1A is a schematic and partial view, in cross-section, of a current-assisted photonic demodulator 1 according to one embodiment, belonging here to a matrix of identical planar demodulators 1.

A three-dimensional direct reference frame XYZ is defined herein and for the following description, where the X and Y axes form a plane parallel to the main plane of the demodulators 1, and where the Z axis is oriented along the thickness of the detection portion 10 of the demodulator 1, from the second face F2 in the direction of the first face F1. The terms "lower" and "upper" refer to an increasing positioning in the direction +Z defined on FIG. 1A.

Each demodulator 1 includes a detection portion 10 here produced based on germanium, and is therefore advantageously adapted to detect light radiation in the near infrared (SWIR) corresponding to the spectral range from approximately 0.8 µm to 1.7 µm, or even to approximately 2.5 µm. In other words, it is adapted to detect light radiation with a wavelength ranging from 800 nm to a cutoff wavelength above 1550 nm.

In the context of the invention, the demodulator 1 includes:

a detection portion 10, extending vertically between a first face F1 and a second face F2. It includes: at least two p-doped regions 11, adapted to generate and modulate a drift current, lying flush with the first face F1 and located on either side of a central zone Zc thereof; and at least two n-doped regions 12, adapted to collect the photogenerated minority carriers, lying flush with the first face F1 and located adjacent to the p-doped regions 11;

a dielectric passivation layer 2, produced from at least one electrically non-conductive material, which covers the first face F1;

modulation electrodes M1, M2, passing through the dielectric passivation layer 2 to come into contact with the p-doped regions 11; and collection electrodes C1, C2, passing through the dielectric passivation layer 2 to come into contact with the n-doped regions 12;

intermediate electrodes I1, I2, reverse (negatively) biased, partly passing through the dielectric passivation layer 2 and spaced apart from the first face F1 by a non-zero distance, each being located, in projection in the main plane XY, between one of the p-doped regions 11 and the adjacent n-doped region 12.

Figure 4A:
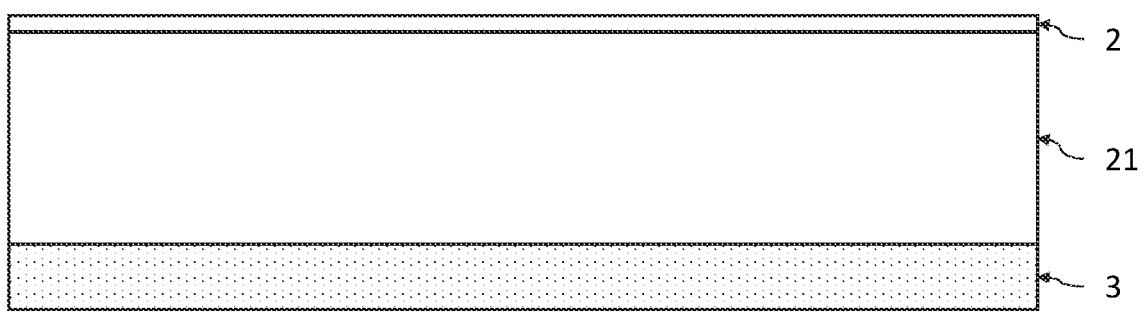
FIGS. 4A to 4I illustrate various steps of a method for manufacturing a demodulator identical or similar to that of FIG. 1B.

In this example, the demodulators 1 have a planar configuration since they are produced here from the same main semiconductor layer 21 (cf. FIG. 4A). The latter extends in a main plane XY, and has a first face F1 and a second face F2 opposite to each other and parallel to the main plane. The two faces F1, F2 therefore extend along identical planes for each of the demodulators 1, and vertically delimit (along the thickness axis Z) the detection portions 10 of the demodulators 1. Thus the demodulators 1 do not have a mesa structure since they are produced here from the same main semiconductor layer 21. The first face F1 is here the one that receives the light radiation to be detected.

Each demodulator 1 includes a detection portion 10 here produced based on germanium, and therefore adapted to detect light radiation in the near infrared (SWIR). The detection portion 10 is a part of the main semiconductor layer 21. The thickness of the detection portion 10, defined along the axis Z between the first and second faces F1, F2, is here substantially constant from one demodulator 1 to the other, for example is between a few hundreds of nanometres and a few microns, for example between approximately 1 µm and 5 µm. The thickness is selected so as to obtain a good absorption in the range of wavelengths of the light radiation to be detected. The detection portion 10 has a transverse dimension in the plane XY that can be between a few hundreds of nanometres and a few tens of microns, for example between approximately 1 µm and 20 µm, for example equal to 10 µm.

The detection portion 10 is produced from at least one crystalline semiconductor material, and preferably monocrystalline. It is here produced based on germanium, i.e. the semiconductor material or materials are germanium or a compound (binary or ternary etc) formed from at least germanium. Thus the detection portion 10 can be produced for example from germanium Ge, from silicon germanium SiGe, from germanium tin GeSn, or even from silicon germanium tin SiGeSn. It can thus be produced from the same semiconductor material and have regions with different conductivity types (homojunction) so as to form a pn or pin junction. It can in a variant be a stack of sublayers of various semiconductor materials (heterojunction), which are then formed based on germanium. Preferably, the detection portion 10 is produced from germanium.

The detection portion 10 includes an intermediate region 13, not intentionally doped (with an optional residual p doping) or lightly p doped. The intermediate region 13 extends between the faces F1 and F2, as well as in the plane XY, and forms the main region absorbing the light radiation to be detected. It surrounds in the plane XY the p-doped regions 11 and the n-doped regions 12.

The detection portion 10 includes at least two p-doped regions 11, here p+ doped, adapted to generate and modulate the drift current via the electrical potential that is imposed on them by the modulation electrodes M1 and M2. They are here p+ doped, and have for example a doping of between approximately $10^{18}$ and $10^{20}$ at/cm$^3$, preferably $10^{19}$ at/cm$^3$. They lie flush with the first face F1 and extend in the direction of the second face F2 along the axis Z over a predefined depth $P_M$. The depth $P_M$ can be defined here as being the distance along the axis Z between the first face F1 and a zone where the doping level is locally equal to half the maximum doping level. Moreover, the two p+ doped regions 11 are located in the plane XY on either side of a central zone Zc of the first face F1, where the light radiation of interest is intended to be received.

The detection portion 10 also includes at least two n-doped regions 12, here n+ doped, adapted to collect the photogenerated minority carriers (photocurrent) resulting from the absorption of the light radiation to be detected in the intermediate region, via the electrical potential that is imposed on them by the collection electrodes C1 and C2. They are here n+ doped, and can have a doping that can be between approximately $5 \times 10^{18}$ and $10^{20}$ at/cm$^3$. They lie flush with the first face F1 and extend in the direction of the second face F2 along the axis Z over a predefined depth $P_C$. The depth $P_C$ can be defined here in the same way as for the depth $P_M$. Moreover, the two n+ doped regions 12 are located adjacent to the p+ doped regions 11.

Figure 1B:
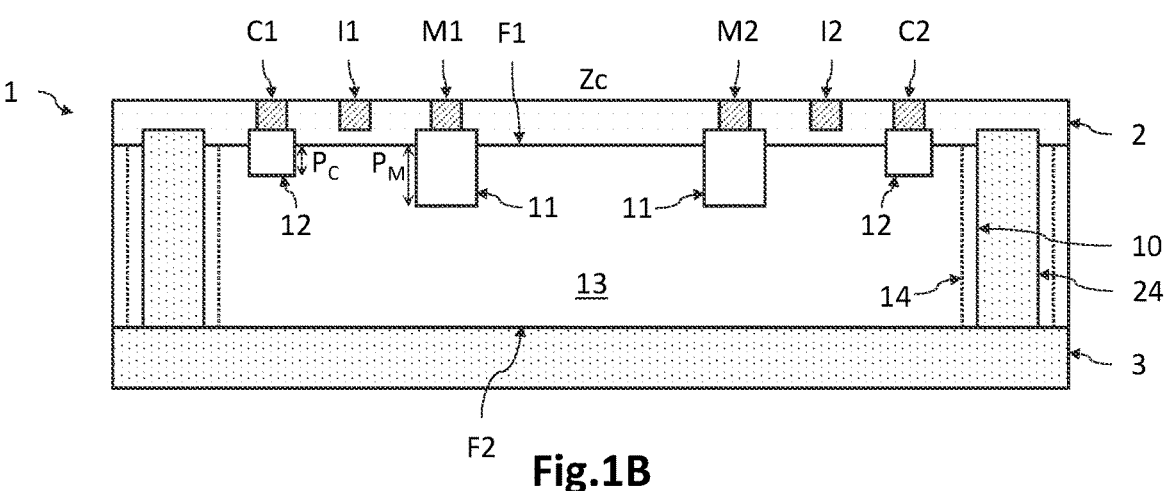
Figure 1C:
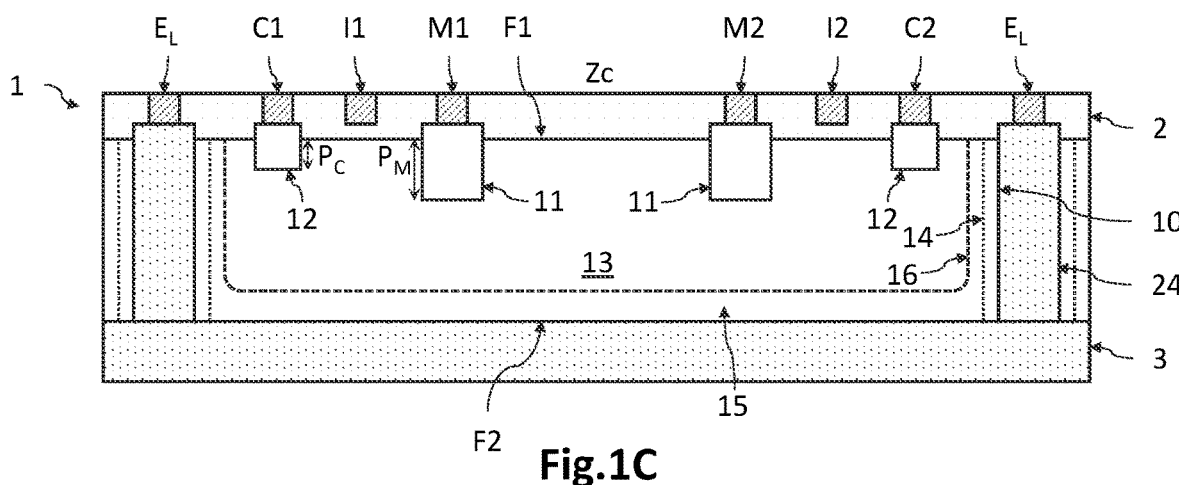

It should be noted that the p-doped regions 11 and the n-doped regions 12 can be produced, as on FIG. 1A, by localised ion implantation in the detection portion 10 as from the first face F1, or, in a variant, as illustrated on FIG. 1B and FIG. 1C, by doping by growth during epitaxial regrowth in indentations formed as from the first face F1 of the detection portion 10.

Lying flush with means "arriving at the level of" or "extends as from". The n+ doped regions 12 and the p+ doped regions 11 are disposed in the plane XY on either side of the central zone Zc. In a configuration illustrated on FIG. 1A, the p+ doped regions 11 are disposed in proximity to the central zone Zc whereas the n+ doped regions 12 are distant therefrom. In a variant, this arrangement can be reversed, so that the n+ doped regions 12 are disposed in proximity to the central zone Zc whereas the p+ doped regions 11 are distant therefrom.

The detection portion 10 is advantageously delimited laterally, in the plane XY, by a peripheral lateral portion 24, filled with a semiconductor material preferably based on silicon, optionally p-doped. The peripheral lateral portion 24 provides lateral optical isolation of the demodulators 1 in the plane XY, and advantageously provides powering up in the plane XY of the material of the detection portion 10, thus increasing the cutoff wavelength of absorption of the incident light radiation. It preferably extends here over the entire thickness of the detection portion 10 to emerge on the support layer 3. The internal face of this peripheral lateral portion 24 then defines the lateral border of the detection portion 10.

The semiconductor material is preferably based on silicon, for example amorphous silicon, mono- or polycrystalline silicon, or silicon germanium, so as advantageously to form a lateral zone 14 produced based on silicon germanium. The lateral zone 14 lies flush with the lateral border and is in contact with the peripheral lateral portion 24. Thus the lateral zone 14 has a forbidden band energy (gap) greater than that of the detection portion 10 produced from germanium. This lateral "gap opening" makes it possible to reduce the sensitivity of the demodulator 1 to defects present in proximity to the trenches. Thus the performances of the demodulator 1 are also improved.

The demodulator 1 includes a dielectric passivation layer 2, produced from at least one electrically non-conductive material, such as an insulating material or an intrinsic semiconductor material, which covers the first face F1, and makes it possible to passivate the detection portion 10 and to electrically isolate the electrodes M1, M2, C1, C2, I1, I2. It is thus in contact with the p+ doped regions 11 and the n+ doped regions 12, as well as with the intermediate region 13. It is preferably produced from an oxide, such as silicon, aluminium, germanium, hafnium oxide, etc. . . . or for example from intrinsic silicon. It has a thickness for example between 2 nm and 500 nm.

Moreover, the detection portion 10 rests on a support layer 3, produced here from a semiconductor crystalline material adapted to the epitaxy of the germanium of the detection portion 10. It is here produced from silicon. In a variant, the detection portion 10 can rest on a bottom insulating layer produced from an electrically insulating material, optionally covered with a thin nucleation layer based on silicon. This support layer 3 can be a top layer of an SiGeOi substrate or of a GeOi substrate.

The demodulator 1 includes modulation electrodes M1, M2, making it possible to generate and modulate a drift current, which passes through the dielectric passivation layer 2 to come into contact with the p+ doped regions 11 and to apply thereto a positive or zero electrical potential. They are connected to an electrical control circuit. It also includes collection electrodes C1, C2, for connecting the photogenerated electrons (photocurrent), which pass through the dielectric passivation layer 2 to come into contact with the n+ doped regions 12 and to apply thereto a positive electrical potential. They are connected to an electrical reading circuit.

According to the invention, the demodulator 1 also includes intermediate electrodes I1, I2, reverse biased (i.e. negatively), each located between one of the p-doped regions 11 and the adjacent n-doped region 12 in the plane XY. In other words, projected in the plane XY, each intermediate electrode I1 and I2 is located between a doped region 11 and the adjacent region 12. They are each spaced apart from the first face F1 by a non-zero distance by the dielectric passivation layer 2. This spacing distance, defined along the axis Z, is preferably between 5 nm and 50 nm, and preferably equal to approximately 10 nm. In this example, the intermediate electrodes I1, I2 are each located in an indentation not passing through the dielectric passivation layer 2. These intermediate electrodes I1, I2 are therefore not in contact with the first face F1 of the detection portion 10. Each intermediate electrode I1, I2 is intended to be negatively biased, whereas the modulation electrodes M1, M2 and collection electrodes C1, C2 are intended to be positively or zero biased.

The inventors have found that the presence of these intermediate electrodes I1, I2 between the p+ doped regions 11 and their adjacent n+ doped regions 12, projected in the plane XY, makes it possible to improve the electrical isolation between the p+ doped regions 11 and the n+ regions 12, which leads to improving the performances of the demodulator 1. This is because it appears that, in the absence of these intermediate electrodes I1, I2, photogenerated electrons may be trapped by the recombination at the interfaces at the first face F1, in the zones located between each p+ doped region 11 and its adjacent n+ doped region 12. This results in a degradation of the temporal impulse response (TIR), of the parasitic light sensitivity (PLS) and of the bandwidth of the demodulator. On the contrary, the presence of the intermediate electrodes I1, I2 leads to an accumulation of majority carriers (holes) under the dielectric passivation layer 2 at the first face F1, between each p+ doped region 11 and its adjacent n+ doped region 12. This results in a reduction in the recombination of the electrons photogenerated at the interface between the dielectric passivation layer 2 and the detection portion 10. This better electrical isolation between each p+ doped region 11 and its adjacent n+ doped region 12 allows a reduction in the distance in the plane XY between these two doped regions. In terms of performances, the presence of the intermediate electrodes I1, I2 results in an increase in the temporal impulse response, in particular in the AC demodulation contrast, of the bandwidth, and therefore in a reduction in the parasitic light sensitivity.

FIG. 1B is a schematic and partial view, in cross-section, of a current-assisted photonic demodulator 1 according to another embodiment. Here the demodulator 1 is distinguished from the one in FIG. 1A essentially in that the p+ doped modulation regions 11 have a greater depth $P_M$ than the depth $P_C$ of the n+ doped collection regions 12. Preferably, the p+ doped regions 11 are alongside the central zone Zc of the first face F1 whereas the n+ doped regions 12 are distant therefrom.

Figure 4B:
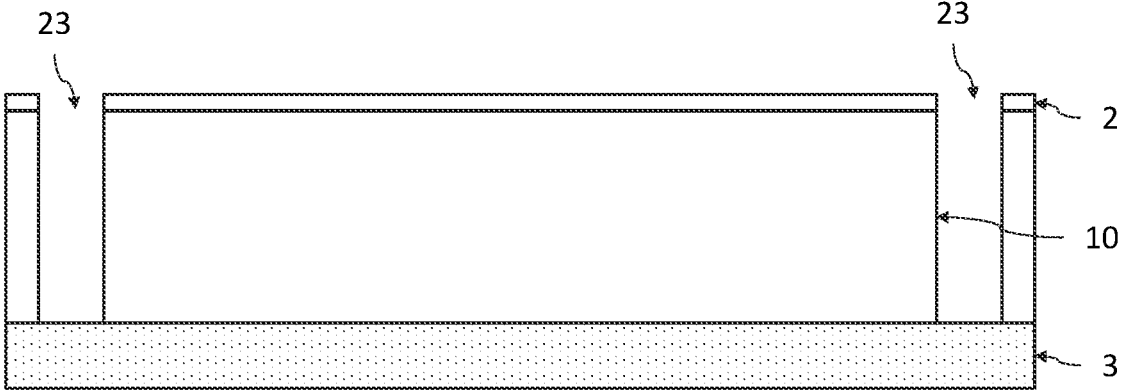
Figure 4C:
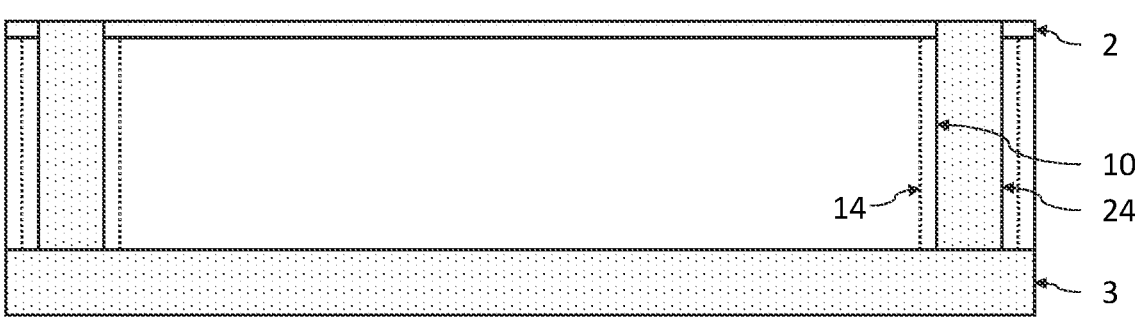
Figure 4D:
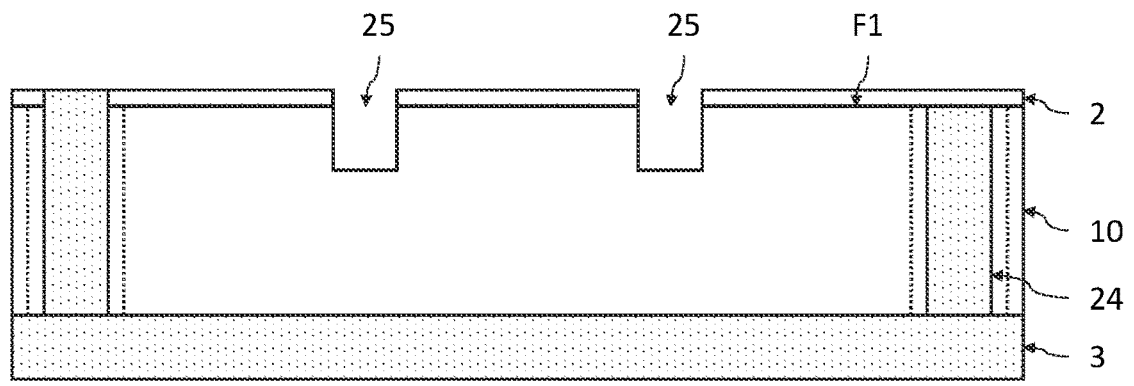
Figure 4E:
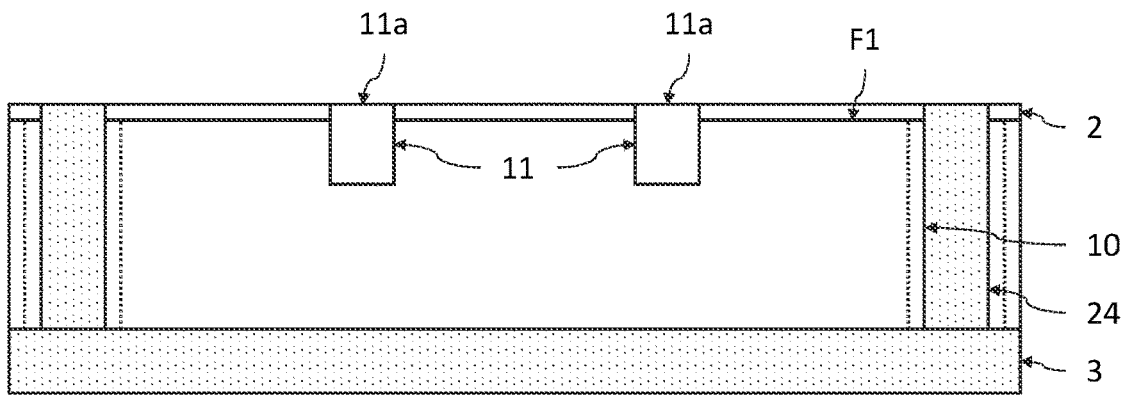

In this example, each p+ doped region 11 is formed by a semiconductor portion 11a, here p+ doped, produced based on germanium and preferably made from the same material as that of the detection portion 10, by epitaxial regrowth as from an indentation 25 formed from the first face F1 (cf. FIG. 4D and FIG. 4E). The semiconductor portion 11a is p doped by growth rather than by localised ion implantation. Preferably, the semiconductor portions 11a are produced from boron-doped germanium with a doping level of the order of $10^{19}$ cm$^{-3}$.

Figure 4F:
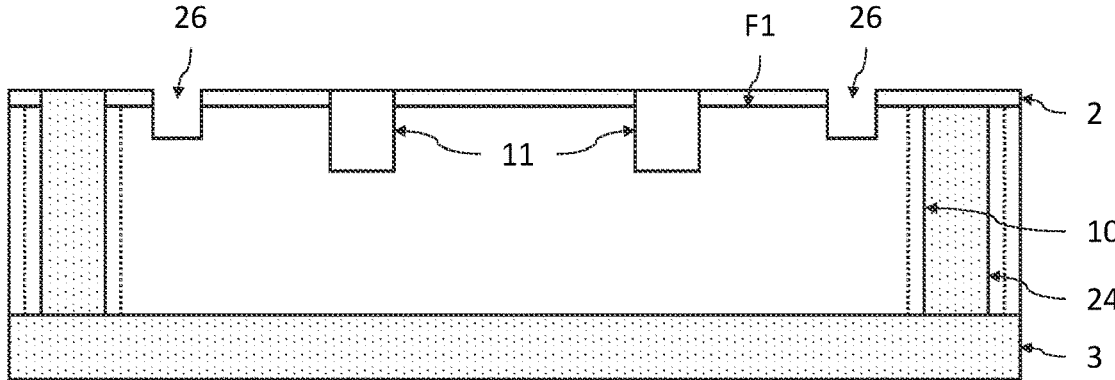
Figure 4G:
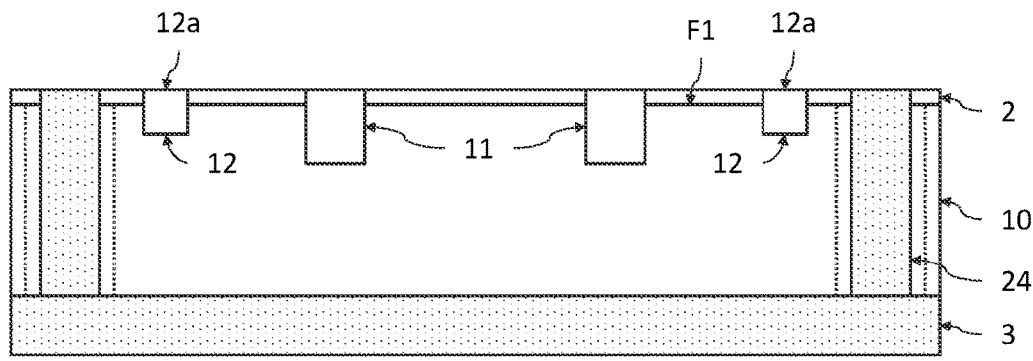

Preferably, the n+ doped regions 12 are also each formed by a semiconductor portion 12a, here n+ doped, produced based on germanium and preferably made from the same material as that of the detection portion 10, by epitaxial regrowth as from an indentation 26 formed from the first face F1 (cf. FIG. 4F and FIG. 4G). The semiconductor portion 12a is doped by growth rather than by localised ion implantation.

The depth $P_M$ of the indentations 25 in the p+ doped regions 11 (and therefore the depth of these p+ doped regions 11), is greater than the depth $P_C$ of the indentations 26 in the n+ doped regions 12 (and therefore greater than the depth of the n+ doped regions 12. The inventors have found that this configuration results in an improvement in the temporal impulse response, in particular the AC demodulation contrast, and therefore in a reduction in the parasitic light sensitivity.

The depth $P_M$ is preferably between approximately 0.4 and 1.2 μm, for example equal to approximately 1 μm. This depth $P_M$ is obtained here by the repetition of epitaxy in the indentation 25 and a doping by growth and, preferably, by epitaxial regrowth in the indentation 26 and doping by growth, which makes it possible to limit or even avoid risks of short-circuit (between each p+ doped region 11 and its adjacent n+ doped region 12) that would be present in the case of ion implantation.

FIG. 1C is a schematic and partial view, in cross-section, of a current-assisted photonic demodulator 1 according to another embodiment. Here the demodulator 1 is distinguished from the one in FIG. 1B essentially in that the detection portion 10 includes a p-doped bottom region 15 that lies flush with the second face F2 and extends in the plane XY as far as the peripheral lateral portion 24. The latter is then p doped, and at least one electrode $E_L$ is in contact with the peripheral lateral portion 24 to provide the biasing of the bottom region 15. A negative electrical potential can be applied by the electrode $E_L$. The bottom region 15 makes it possible to reduce the recombination of the photogenerated electrons at any defects in the germanium present at the second face F2. Thus the performances of the demodulator 1 are improved.

A p-doped lateral region 16 may be present in the detection portion 10, along the peripheral lateral portion 24. This p+ doped lateral region 16 makes it possible to avoid the space charge region of the demodulator 1 extending as far as the lateral border. Thus the contribution of this region (potentially not free from defects related to the production of the trenches) to the dark current is limited.

Figure 2A:
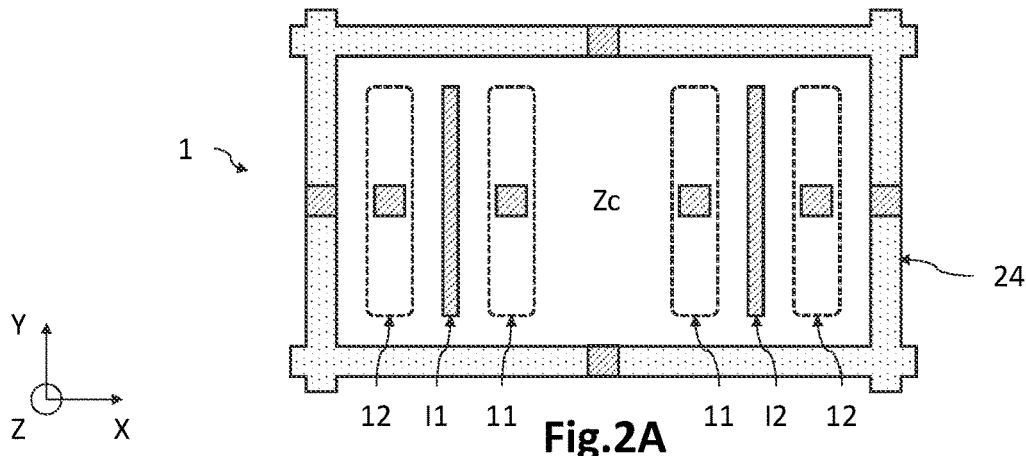
FIG. 2A, FIG. 2B and FIG. 2C are partial schematic views, in plan view, of current-assisted photonic demodulators according to another variant embodiments.
Figure 2B:
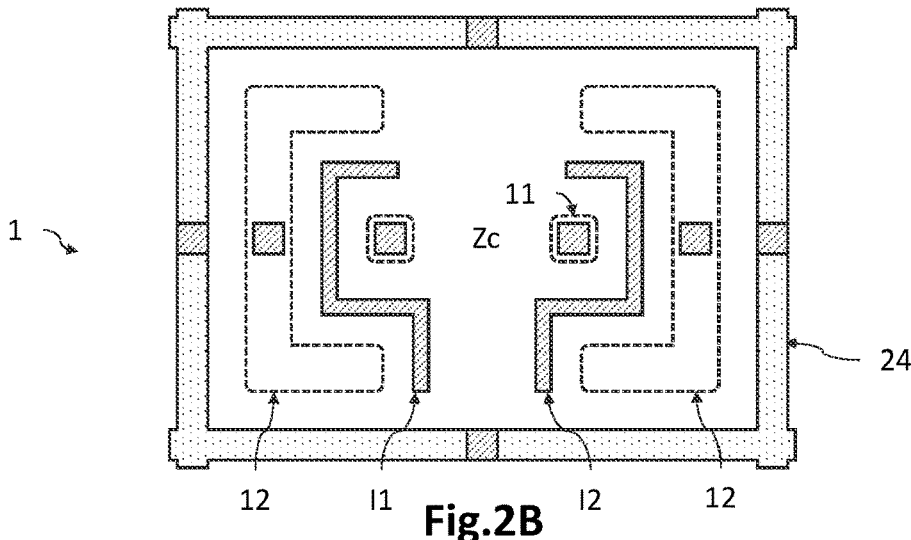
Figure 2C:
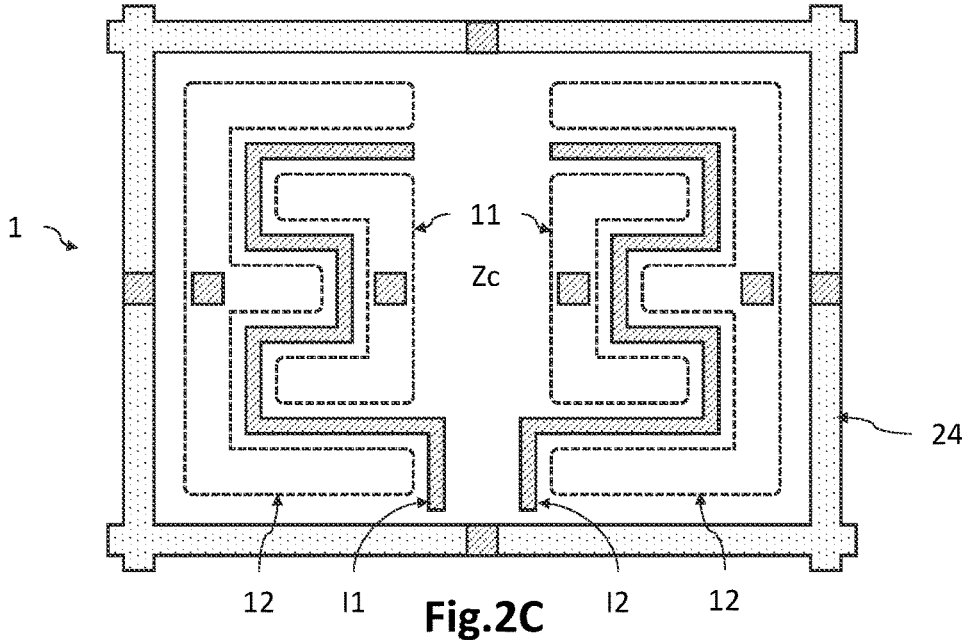

FIGS. 2A to 2C are schematic partial plan views of a matrix of demodulators 1 according to various variants. In these examples, the p+ doped regions 11 are located alongside the central zone Zc of the first face F1 whereas the n+ doped regions 12 are distant therefrom. However, the reverse configuration as possible. Moreover, the detection portion 10 is delimited here by the peripheral lateral portion 24, which provides the optical isolation of the demodulators 1 in the plane XY as well as the powering up of the detection portion 10.

On FIG. 2A, the p+ doped regions 11, the n+ doped regions 12 and the intermediate electrodes I1, I2 extend in the plane XY rectilinearly, here along the axis Y, and parallel to each other.

On FIG. 2B, the p+ doped regions 11 have a substantially square shape in the plane XY, but they could also extend rectilinearly along the axis Y. The n+ doped regions 12 extend in the plane XY so as to partially surround the p+ doped regions 11: they each have a main part that extends along the axis Y and two lateral parts that extend from the ends of the main part in the direction +X. Each intermediate electrode I1, I2 extends in the plane XY in a manner complementary to the n+ doped region 12 so as to remain located between the p+ doped region 11 and the adjacent n+ region 12.

On FIG. 2C, the p+ doped regions 11 and the n+ doped regions 12 have an interdigitated configuration. Each n+ doped region 12 has an E shape with a main part oriented along the axis Y, and with two lateral end parts and a central part oriented along the axis X. The adjacent p+ doped region 11 has a C shape where the lateral end parts extend between the lateral and central parts of the n+ doped region 12. Each intermediate electrode I1, I2 extends between the p+ doped region 11 and the adjacent n+ region 12 so as to remain located between them.

These figures illustrate various configurations of the relative arrangement of the p+ doped regions 11, the n+ doped regions 12 and the intermediate electrodes I1, I2, but other configurations are of course possible.

Figure 3A:
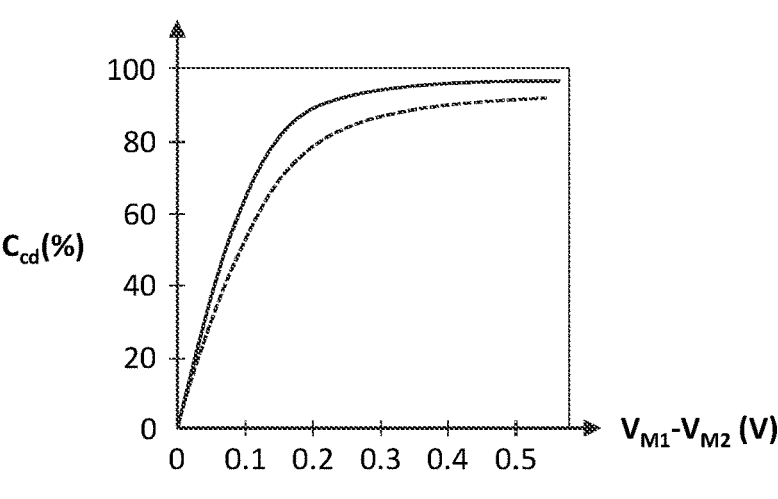
FIG. 3A illustrates an example of change in the DC demodulation contrast as a function of the electrical tension applied between the modulation electrodes, in the case where the demodulator includes, or not, the intermediate electrodes.
Figure 3B:
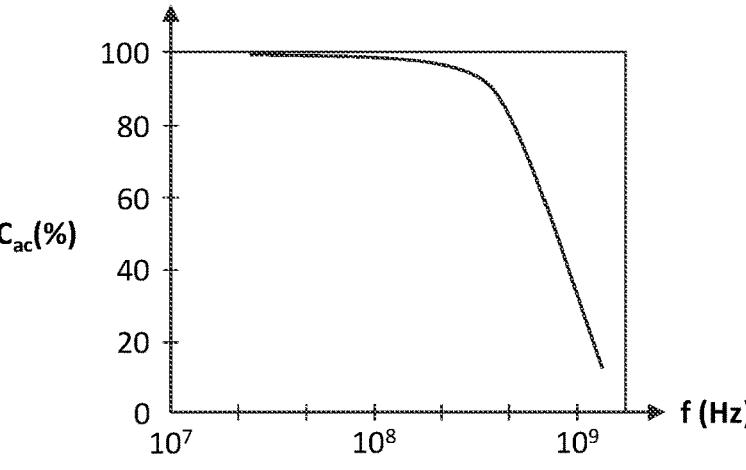
FIG. 3B illustrates an example of change in the AC demodulation contrast as a function of the modulation frequency, in the case where the demodulator includes the intermediate electrodes.
Figure 3C:
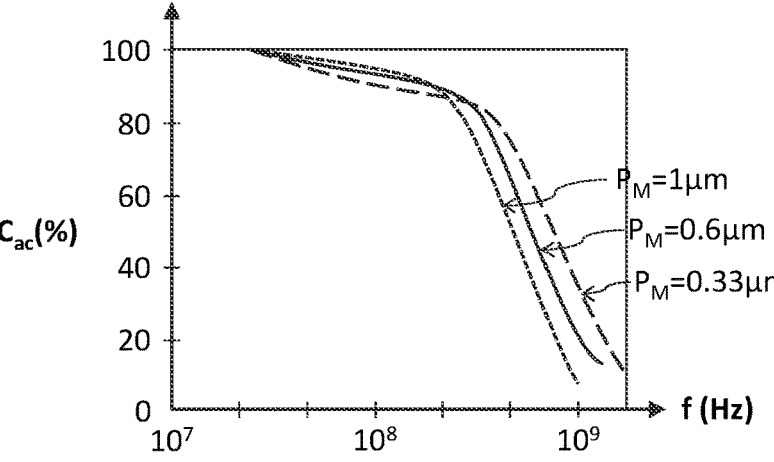
FIG. 3C illustrates an example of change in the AC demodulation contrast as a function of the modulation frequency, in the case where the demodulator does not include the intermediate electrodes, and for various values of the depth of the p-doped regions.

FIGS. 3A to 3C illustrate examples of figures of merit of a demodulator 1 including one or other of the advantageous features described above.

FIG. 3A illustrates an example of change in the demodulation contrast $C_{dc}$ when the DC component of the measured photocurrent is considered, as a function of the electrical tension applied between the modulation electrodes M1 and M2.

As described in particular in the scientific article by Dalla Betta et al. entitled *Design and Characterization of Current-Assisted Photonic Demodulators in 0.18-μm CMOS Technology*, IEEE Trans. Electron Devices, vol. 58, n+. 6, pp. 1702-1707, June 2011, the demodulation contrast $C_d$ is defined as: $C_d = f_{C1}{}^{ac} \times I_{tot}{}^{ac} / I_{tot}{}^{ac}$, where $I_{tot}$ is the total photocurrent collected at the electrodes C1 and C2: $I_{tot} = I_{C1} + I_{C2}$; and $f_{C1}$ is the fraction of the photocurrent $I_{tot}$ collected by the electrode C1. In the case where the incident light radiation is modulated sinusoidally in power and the electrical tension applied between the modulation electrodes M1 and M2 is also sinusoidal, in phase and with the same frequency as the light radiation, the collected photocurrents can be written thus:

$$I_{C1} = \left[1/2 + f_{C1}^{ac} \sin(2\pi ft)\right] \times \left[I_{top}^{dc} + I_{tot}^{ac} \sin(2\pi ft - \varphi)\right]$$

$$I_{C2} = \left[1/2 - f_{C1}^{ac} \sin(2\pi ft)\right] \times \left[I_{top}^{dc} + I_{tot}^{ac} \sin(2\pi ft - \varphi)\right]$$

where $I_{tot}{}^{dc}$ and $I_{tot}{}^{ac}$ are the continuous and alternating components of the measured photocurrent $I_{tot}$, $f_{C1}$ is the amplitude of the AC component of the fraction $f_{C1}$, f is the modulation frequency, and $\varphi$ is the phase difference between the emitted light and the received light. From these two equations, it is possible to access the mean of the currents $I_{C1}$ and $I_{C2}$ that directly contain the phase $\varphi$, which can be written as:

$$< I_{C1} > = \frac{1}{2}I_{tot}^{dc} + \frac{1}{2}f_{C1}^{ac}I_{tot}^{ac} \cos(\varphi)$$

$$< I_{C2} > = \frac{1}{2}I_{tot}^{dc} - \frac{1}{2}f_{C1}^{ac}I_{tot}^{ac} \cos(\varphi)$$

It is therefore possible to define the DC demodulation contrast such that: $C_{dc} = (I_{C1} - I_{C2})/I_{tot}$, and obtaining the distance "d" of the target can be using the phase from the following formula:

$$d = \frac{c\varphi}{4\pi f}$$

where "c" is the speed of light in vacuum.

In this example, the detected light radiation is in the near infrared and has a centre wavelength of 1.4 μm and an irradiance of 0.001 W/cm². The detection portion 10 is produced from germanium. The p+ doped regions 11 have a depth $P_M$ equal to 1.1 μm and the n+ doped regions 12 have a depth $P_C$ equal to 0.23 μm. They are spaced apart in the plane XY by a distance of 0.5 μm.

As shown by FIG. 3A, the DC demodulation contrast $C_{dc}$ increases from 0 to more than 90% as a function of the modulation voltage $V_{M1} - V_{M2}$. In the case where the demodulator 1 does not include intermediate electrodes I1, I2 (broken line on FIG. 3A), the demodulation contrast $C_{dc}$ has a value of approximately 80% at 0.2 V, and a value of approximately 92% at 0.5 V. On the other hand, in the case where the demodulator 1 includes intermediate electrodes I1, I2 as described previously (continuous line on FIG. 3A), the demodulation contrast $C_{dc}$ has a value of approximately 90% at 0.2 V, and a value of approximately 97% at 0.5 V. Thus the presence of the intermediate electrodes I1, I2 greatly improves the performances of the demodulator 1.

FIG. 3B illustrates the change in the AC demodulation contrast $C_{ac}$ in the case of the demodulator 1 of FIG. 3A that includes the intermediate electrodes I1, I2. This change is here a function of the modulation frequency f. The demodulation contrast $C_{ac}$ is defined by the following equation (simplified here to a bidimensional configuration): $C_{ac}(f) = (Q_{C1}(t) - Q_{C2}(t))/Q_{tot}$, where $Q_{C1}$ and $Q_{C2}$ are the electrical charges at the electrodes C1 and C2, and $Q_{tot}$ is the total charge in the demodulator 1. It should be stated here that the DC demodulation contrast $C_{dc}$ does not involve the frequency (static contrast). On the other hand, the AC demodulation contrast $C_{ac}$ is a contrast that is extracted from the temporal variation in the currents harvested by the n+ doped collection regions. Integrating these two currents gives the quantities of charges in the demodulator.

It is clear that the demodulation contrast $C_{ac}$ is equal to 98.4% at 100 MHz, to 98.0% at 200 MHz, and to 95.7% at 300 MHz. The parasitic light sensitivity PLS, defined by the following equation: $PLS = (1 - C_{ac}(f=0))/2$, is of the order of only 1%. As we shall see with FIG. 3C, the performances of the demodulator 1 are greatly improved also in terms of demodulation contrast $C_{ac}$ and PLS.

FIG. 3C illustrates the change in the demodulation contrast $C_{ac}$, as a function of the modulation frequency f, of a demodulator 1 not including the intermediate electrodes I1, I2, and for various values of the depth $P_M$ of the p+ doped regions 11. Whereas the depth $P_C$ of the n+ doped regions 12 remains fixed at 0.23 μm, the depth $P_M$ is 0.33 μm, 0.6 μm or 1 μm. The incident light is a pulse with a duration of 50 ps at a centre wavelength of 1.4 μm with an irradiance of 0.1 W/cm². The electrical potentials $V_{C1}$ and $V_{C2}$ are equal to +1 V and the electrical voltage $V_{M1} - V_{M2}$ between the electrodes M1 and M2 is equal to +0.7 V.

It is clear that the demodulation contrast Cac increases with the depth$_M$ of the p+ doped regions 11. For the depth $P_M$ of 0.33 μm, 0.6 μm and then 1 μm, the demodulation contrast Cac changes respectively from 90.3%, to 92.8% and then to 94.9%, for the frequency of 100 MHz. In addition, it changes from 87.2% to 89.9% and then to 90.7%, for the frequency of 200 MHz, and finally changes from 84.2% to 85.4% and then to 77.9%, for the frequency of 300 MHz. Finally, the PLS decreases from 3.7% to 2.8%, and then to 1.8%. Thus increasing the depth $P_M$ of the p+ doped regions 11 effectively improves the performances of the demodulator 1. It should also be noted that the presence of the intermediate electrodes I1, I2 also improves the performances of the demodulator 1, since the demodulation contrast $C_{ac}$ changes in particular from 90.7% to 98% for the frequency of 200 MHz, the PLS decreases from approximately 1.8% to approximately 1%, and finally the bandwidth is increased.

Thus the presence of the intermediate electrodes I1, I2 greatly improves the performances of the demodulator 1, in terms of both demodulation contrast $C_{ac}$ and PLS but also bandwidth. In addition, producing p+ doped regions 11 deeper than the n+ doped regions 12 also improves the performances of the demodulator 1.

FIGS. 4A to 4I illustrate various steps of a method for manufacturing a matrix of current-assisted photonic demodulators 1 identical or similar to the one illustrated in FIG. 1B. The demodulators 1 here have a planar configuration. They are produced based on germanium and therefore adapted to detect infrared radiation in the near infrared. The detection portions 10 are produced from germanium.

With reference to FIG. 4A, the main semiconductor layer 21 is produced by epitaxy from the support layer 3. In this example, the support layer 3 is made from monocrystalline silicon, and the main semiconductor layer 21 is made from not intentionally doped germanium and has a thickness of between approximately 1 μm and approximately 3 μm, for example 1.5 μm. It can be produced as described in particular in the publication by Hartmann & Aubin entitled *Assessment of the growth/etch back technique for the production of Ge strain-relaxed buffers on Si*, Journal of Crystal Growth, 488 (2018), 43. The main semiconductor layer 21 then has a very low density of emergent dislocations (for example of the order of 107 dislocations/cm$^2$), which helps to reduce the dark current in the detection portion 10 of the demodulator 1. As indicated previously, the main semiconductor layer 21 can include a bottom p-doped region, for example with a thickness of 200 nm and the boron doping level of which is of the order of $5 \times 10^{19}$ cm$^{-3}$.

In a variant, the main semiconductor layer 21 can be deposited from a substrate of the GeOI type (standing for germanium on insulator). Thus the support layer 3 can be a nucleation layer of germanium of a few tens to a few hundreds of nanometres resting on a bottom layer of approximately 2 nm of silicon, which rests on an isolating layer from a few tens of nm to a few microns thick, and then on a silicon substrate. Such a GeOI substrate can be produced by means of the method described in the publication by Reboud et al. entitled *Structural and optical properties of* 200 *mm germanium-on-insulator* (*GeOI*) *substrates for silicon photonics applications, Proc.* SPIE 9367, Silicon Photonics X, 936714 (Feb. 27, 2015).

Finally, a dielectric passivation layer 2 is deposited on the top face of the main semiconductor layer 21. This dielectric passivation layer 2 can be formed from a first passivation sublayer 2.1 (cf. FIG. 4I), produced for example from an aluminium oxide deposited by an atomic layer deposition (ALD) with a thickness of the order of 5 to 30 nm, for example 10 nm, or even by a fine layer of non-doped silicon with a thickness ranging from 1 to 4 nm, deposited by epitaxy on the germanium of the detection portion 10. Next, a second sublayer 2.2 (cf. FIG. 4I), produced for example from a silicon oxide such as SiO$_2$ TEOS (tetraethyl orthosilicate) with a thickness of the order of 20 to 100 nm, is deposited on the first sublayer 2.1.

With reference to FIG. 4B, trenches 23 intended to pixelate the demodulators 1 by the peripheral lateral portions 24 are produced by photolithography and etching. A localised etching of the main germanium semiconductor layer 21 is thus implemented, to emerge on the support layer 3. Each trench 23 preferably extends continuously in the plane XY around a demodulator 1. A plurality of detection portions 10 separated from each other by a continuous trench 23 are thus obtained. They are preferably obtained by an anisotropic etching technique, so as to obtain a substantially vertical lateral border along the axis Z. The trenches 23 have a transverse dimension (width) in the plane XY that can be between 0.5 μm and 2 μm, for example equal to 1 μm. The detection portion 10 can thus have a shape in the plane XY for example circular, oval, polygonal, for example square, or any other shape.

With reference to FIG. 4C, the peripheral lateral portion 24 is produced, by epitaxy in the trenches 23, from a crystalline semiconductor material based on silicon. This can in particular be silicon or polysilicon. It can be p-doped, for example with boron with a doping level of the order of $4 \times 10^{19}$ cm$^{-3}$. This material has a coefficient of thermal expansion less than that of the detection portion 10 based on germanium, so that, on returning to ambient temperature (after the epitaxy of the silicon in the trenches), the detection portion 10 has tensile mechanical stresses in the plane XY. Next an interdiffusion annealing is implemented to form the lateral zone 14 based on SiGe. Finally, a chemical mechanical polishing (CMP) step is next implemented, with stoppage on the top face of the dielectric passivation layer 2, to eliminate the excess material based on silicon and to flatten the top face of the stack.

With reference to FIG. 4D, indentations 25 (non-through openings) are produced, by photolithography and etching, through the dielectric passivation layer 2 and in the detection portion 10, at the first face F1, on either side of the central zone Zc. These indentations 25 are intended for producing the p+ doped regions 11. The depth of the indentations 25 with respect to the first face F1 corresponds to the depth P$_M$ of what will be the p+ doped regions 11. For a detection portion 10 with a thickness of approximately 1.5 μm, the depth P$_M$ can be of the order of approximately 0.4 to 1 μm.

With reference to FIG. 4E, the p+ doped regions 11 are produced by epitaxial regrowth, here of germanium, in the indentations 25, with p-type doping (here with boron) by growth. The growth temperature can be of the order of 600° C. The doping level can be of the order of $10^{19}$ cm$^{-3}$. The p+ doped regions 11 are formed by the semiconductor portions 11a. A chemical mechanical polishing step is next implemented, with stoppage on the top face of the dielectric passivation layer 2.

With reference to FIG. 4F, indentations 26 are produced, by photolithography and etching, through the dielectric passivation layer 2 and in the detection portion 10, from the first face F1. These indentations 26 are intended for producing the n+ doped regions 12. They are also located on either side of the central zone Zc of the first face F1, and are adjacent to the first p+ doped regions 11. The depth of the indentations 26 with respect to the first face F1 corresponds to the depth P$_C$ of what will be the n+ doped regions 12, this depth P$_C$ advantageously being less than P$_M$.

With reference to FIG. 4G, the n+ doped regions 12 are produced by epitaxial regrowth, here of germanium, in the indentations 26, with n-type doping (here with phosphorus) by growth. The growth temperature can be of the order of 400 to 600° C. The doping level can be of the order of $5 \times 10^{18}$ to $10^{20}$ cm$^{-3}$. The n+ doped regions 12 are formed by the semiconductor portions 12a. A chemical mechanical polishing step is next implemented, with stoppage on the top face of the dielectric passivation layer 2. It should be stated that, in a variant, the n+ doped regions 12 can be produced by localised ion implantation of phosphorus, arsenic or antimony.

Figure 4H:
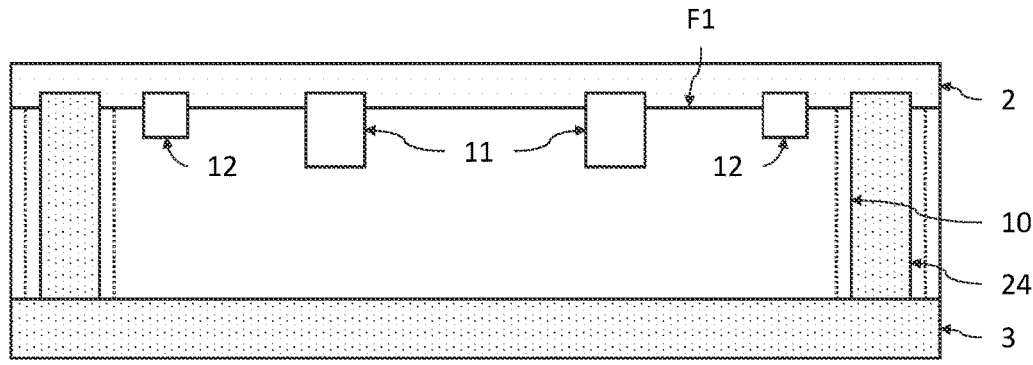

With reference to FIG. 4H, a new dielectric layer is deposited on the underlying dielectric layer 2, so as to cover the p+ doped regions 11, the n+ doped regions 12 and the peripheral lateral portion 24.

Figure 4I:
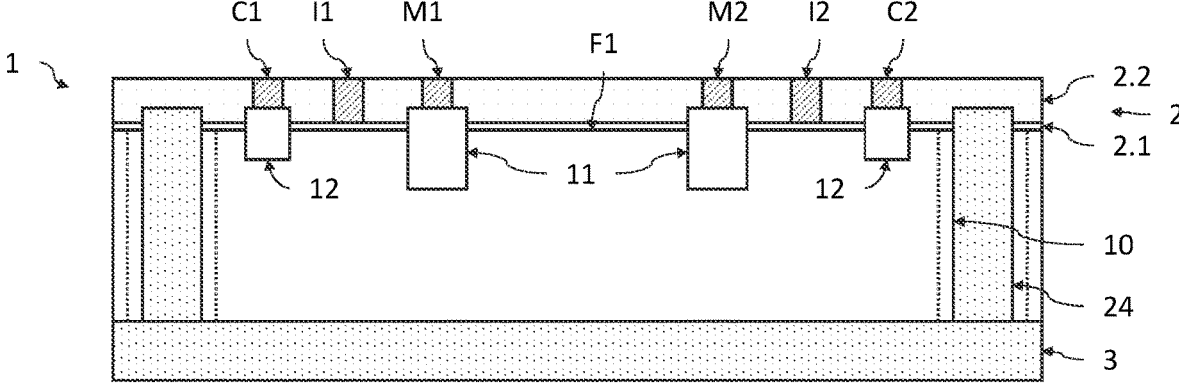

With reference to FIG. 4I, the electrodes M1, M2 that extend through the dielectric passivation layer 2 and come into contact with the p+ doped regions 11; the collection electrodes C1 and C2 that extend through the dielectric passivation layer and come into contact with the n+ doped regions 12; and the intermediate electrodes I1, I2, are produced. The latter are located, in projection in the plane XY, between each p+ doped region and its adjacent n+ doped region. They are spaced apart from the first face F1 by a non-zero distance by the dielectric passivation layer 2. In the case where the latter is formed from a first sublayer 2.1 of Al₂O₃ covered with a second sublayer 2.2 of TEOS, the intermediate electrodes I1, I2 can extend through the sublayer 2.2 of TEOS and come into contact with the sublayer 2.1 of Al₂O₃.

In this way a matrix of current-assisted photonic demodulators 1 is obtained, here in planar configuration, which has improved performances, in particular in terms of demodulation contrast C$_{ac}$, PLS and bandwidth. The risks of short-circuit between the p+ doped regions 11 and the n+ doped regions 12 are also avoided by producing the deep p+ doped regions 11 by repetition of epitaxy and doping by growth, and preferably by doing the same for producing the shallow n+ doped regions 12.

Particular embodiments have just been described. Various variations and modifications will appear to a person skilled in the art.

The invention claimed is:

1. A current-assisted photonic demodulator configured to detect light radiation of interest, including:

a detection portion, extending vertically between a first face and a second face both parallel to a main plane, and including:

at least two p-doped regions, intended to generate and modulate a drift current in the detection portion, lying flush with the first face and located on either side of a central zone of the first face;

at least two n-doped regions, configured to collect the minority charge carriers photogenerated during the absorption of the light radiation of interest in the detection portion, lying flush with the first face and located adjacent to the p-doped regions;

a dielectric passivation layer, produced from an electrically insulating material, and covering the first face;

modulation electrodes, passing through the dielectric passivation layer and in contact with the p-doped regions; and collection electrodes, passing through the dielectric passivation layer and in contact with the n-doped regions;

intermediate electrodes, intended to be negatively biased, partly passing through the dielectric passivation layer and spaced apart from the first face by a non-zero distance, each being located, in projection in the main plane, between one of the p-doped regions and the adjacent n-doped region.

2. The photonic demodulator according to claim 1, wherein the intermediate electrodes are spaced apart from the first face by a distance of between 5 nm and 50 nm.

3. The photonic demodulator according to claim 1, wherein the p-doped regions have a depth from the first face greater than a depth of the n-doped regions.

4. The photonic demodulator according to claim 1, wherein p-doped regions are located, in projection in the main plane, in proximity to the central zone, and the n-doped regions being distant therefrom.

5. The photonic demodulator according to claim 1, wherein the p-doped regions are first semiconductor portions located in first indentations in the detection portion.

6. The photonic demodulator according to claim 1, wherein the n-doped regions are first semiconductor portions located in second indentations in the detection portion.

7. The photonic demodulator according to claim 1, wherein the detection portion is produced based on germanium.

8. The photonic demodulator according to claim 1, including a peripheral lateral portion surrounding the detection portion in the main plane, produced from a semiconductor material based on silicon.

9. The photonic demodulator according to claim 8, wherein the detection portion includes a lateral zone produced based on SiGe, located at the interface with the peripheral lateral portion.

10. A method for manufacturing a photonic demodulator according to claim 1, including the following steps:

producing the detection portion from a material that has not been intentionally doped;

producing the at least two p-doped regions and the at least two n-doped regions in the detection portion;

depositing the dielectric passivation layer on the detection portion;

producing the modulation electrodes, the collection electrodes and the intermediate electrodes.

11. The manufacturing method according to claim 10, wherein the p-doped regions have a depth from the first face greater than the depth of the n-doped regions.

12. The manufacturing method according to claim 10, wherein producing the p-doped regions includes the following steps:

producing first indentations in the detection portion as from the first face;

producing by epitaxy, in the first indentations, first semiconductor portions p-doped by growth.

13. The manufacturing method according to claim 12, wherein producing the n-doped regions includes the following steps:

producing second indentations in the detection portion as from the first face;

producing by epitaxy, in the second indentations, second semiconductor portions n-doped by growth.

14. The manufacturing method according to claim 13, wherein the first indentations have a depth greater than the depth of the second indentations.

* * * * *